United States Patent
Cheong et al.

(10) Patent No.: US 7,478,314 B1
(45) Date of Patent: Jan. 13, 2009

(54) METHODS, ALGORITHMS, SOFTWARE, CIRCUITS, RECEIVERS AND SYSTEM FOR DECODING CONVOLUTIONAL CODE

(75) Inventors: Kok-Wui Cheong, San Jose, CA (US); Dimitrios-Alexandros Toumpakaris, Sunnyvale, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 361 days.

(21) Appl. No.: 11/051,789

(22) Filed: Feb. 4, 2005

Related U.S. Application Data

(60) Provisional application No. 60/599,105, filed on Aug. 5, 2004, provisional application No. 60/599,102, filed on Aug. 4, 2004.

(51) Int. Cl.
*H03M 13/03* (2006.01)
(52) U.S. Cl. .................... 714/794; 714/795
(58) Field of Classification Search ............ 714/794, 714/795
See application file for complete search history.

(56) References Cited

U.S. PATENT DOCUMENTS

| | | | | |
|---|---|---|---|---|
| 5,369,671 | A * | 11/1994 | Yehushua et al. | 375/341 |
| 5,408,502 | A | 4/1995 | How | |
| 5,416,787 | A * | 5/1995 | Kodama et al. | 714/790 |
| 6,580,767 | B1 * | 6/2003 | Koehler et al. | 375/341 |

OTHER PUBLICATIONS

Kok-Wui Cheong and Hui-Ling Lou; Methods, Algorithms, Software, Circuits, Receivers and Systems for Iteratively Decoding a Tailbiting Convolutional Code; U.S. Appl. No. 11/046,070, filed Jan. 28, 2005.

R. V. Cox & C-E. W. Sundberg; A Circular Viterbi Algorithm for Decoding Tailbiting Convolutional Codes; IEEE; 1993; pp. 104-107.

Charles R. Cahn; Viterbi Decoding with Tail Biting in the IEEE 802.16 Standard; Submitted to IEEE 802.16 Broadband Wireless Access Working Group on Aug. 15, 2001; http://ieee802.org/16.

C. R. Cahn; Viterbi Decoding with Tail Biting in the IEEE 802.16 Standard; Dated Aug. 15, 2001; From: Western Multiplex Corporation, 3780 Kilroy Airport Way, Suite 500, Long Beach CA 90806; 2 Pages.

* cited by examiner

*Primary Examiner*—Joseph D Torres

(57) ABSTRACT

Methods, software, circuits and systems involving a low complexity, tailbiting decoder. In various embodiments, the method relates to concatenating an initial and/or terminal subblock of the serial data block and outputting decoded data from an internal block of the modified data block. The circuitry generally includes a buffer, logic configured to concatenate an initial and/or terminal subblock to the serial data block, and a decoder configured to decode the data block, estimate starting and ending states for the data block, and output an internal portion of the serial data block and the one or more sequences as decoded data. The invention advantageously reduces the complexity of a suboptimal convolutional decoder, ensures smooth transitions at the beginning and end of the serial data block during decoding, and increases the reliability of the starting and ending states, without adding overhead to the transmitted data block.

21 Claims, 5 Drawing Sheets

METHODS, ALGORITHMS, SOFTWARE, CIRCUITS, RECEIVERS AND SYSTEM FOR DECODING CONVOLUTIONAL CODE

RELATED APPLICATIONS

This application claims the benefit of U.S. Provisional Application Nos. 60/599,102 and 60/599,105, filed Aug. 4, 2004 and Aug. 5, 2004, respectively, which are incorporated herein by reference in their entireties.

FIELD OF THE INVENTION

The present invention generally relates to the field of encoding and decoding information. More specifically, embodiments of the present invention pertain to methods, algorithms, software, circuits, and systems for data communications in a wireless network using a low complexity, tailbiting Viterbi decoder.

DISCUSSION OF THE BACKGROUND

In data communications, a tailbiting trellis may be used to reduce overhead in convolutional codes that may be caused by returning the trellis to a known ending state. Terminating the encoded data with a known ending state ensures that the traceback to determine the output bits is started from the correct state with the correct cost value. The performance of the decoder generally degrades if the starting and ending states are unknown. However, a known ending state requires extra overhead since known bits need to be added to the transmitted signal to force the encoder to the known ending state. Tailbiting is a technique that forces the starting state to be the same as the ending state, without the penalty of the overhead bits.

In a tailbiting convolutional code, the input bits are generally grouped into blocks with a fixed block length. For each fixed length block of bits, the convolutional encoder is initialized with the final data bits of the code block. Thus, at the end of the block, the encoder is at the same state as the beginning of the block. However, the convolutional decoder in the receiver does not know the starting-and-ending state.

FIG. 1 shows an example of an encoder 10 with a code block length of N and a convolutional code rate of M/N, with a memory length of k. Input data bits $x_1 x_2 \ldots x_N$ are convolutionally encoded by encoder 10 to produce coded data $y_1 y_2 \ldots y_M$. At any given time, encoder 10 has a state $s_1 s_2 \ldots s_k$. After encoding bit $x_N$, $s_1 s_2 \ldots s_k$ will represent the ending state of the encoded data block.

Since the beginning-and-ending state of coded data $y_1 y_2 \ldots y_M$ is unknown, decoding the convolutional code is more complicated. However, there will be a signal-to-noise gain since there is no rate loss penalty compared to a conventional convolutional code that forces the ending state (i.e., the "tail") to a known state. In addition, all of the bits are protected equally, unlike the code with a known tail.

Generally, the optimum method for decoding tailbiting codes is to search through all possible trellis paths with the same initial and ending state, and choose the trellis path with the lowest cost or lowest metric (i.e., the most likely path). The initial state can be forced to a particular value by disallowing transitions from other states (e.g., in accordance with certain predetermined constraints), and the ending state can be forced to the same value as the initial state by starting the traceback from the state with the same value. This optimum decoding becomes prohibitively complex when a convolutional code with many states is used, as in IEEE Standards 802.11a, 802.11b, 802.11 g, 802.11n, 802.16 and 802.20.

By exploiting the cyclic nature of the tailbiting code, a suboptimal decoding scheme with smaller decoding complexity can be used for decoding the convolutional codes. A received block of signals may be replicated, and one or more replicas may be concatenated with the received block and then decoded using a regular Viterbi algorithm ("Viterbi decoding"). Ideally, in such a scheme, the output bits repeat themselves with a period equal to the block length after a few cycles of Viterbi decoding. However, this convergence may not always happen, and as a result, the algorithm is suboptimal.

To prevent Viterbi decoding from entering into an infinite loop when the algorithm does not converge, a fixed number of cyclic concatenations may be decoded, and the output bits at the end used as an estimate of the transmitted bits (see, e.g., R. V. Cox, C. E. W. Sundberg, "An efficient adaptive circular Viterbi algorithm for decoding generalized tailbiting convolutional codes," IEEE Transactions on Vehicular Technology, vol. 43, iss. 1, February 1994, pgs. 57-68). However, in his approach, the entire block of received signals is stored until the block is decoded. In a simplified alternative method, the stored code word is decoded twice, the output from the first decoding cycle is ignored, and the output from the second decoding cycle is retained as the decoded output (see, e.g., C. R. Cahn, "Viterbi Decoding with Tail Biting in the IEEE 802.16 Standard," IEEE 802.16 Broadband Wireless Access Working Group, Aug. 15, 2001). Although the additional storage requirement of the aforementioned method can be satisfied in some cases by sharing memory from a deinterleaver (e.g., as is used in IEEE 802.11- and 802.16-compliant receivers), these approaches generally require more memory than conventional convolutional codes using an optimal decoding solution. In addition, due to the multiple decoding cycles, the Viterbi decoder 20, shown in FIG. 2, has to operate at a speed that is a multiple of the data rate.

A need therefore exists to simplify the operation of Viterbi decoders further, and without sacrificing performance and/or operational efficiencies, to keep up with ever-increasing demands for increased network speeds, performance and capabilities.

SUMMARY OF THE INVENTION

Embodiments of the present invention relate to circuitry, systems, methods, algorithms and software for processing and/or determining a value for a serial data block in a wireless network using a low complexity, tailbiting Viterbi decoder. The method generally includes concatenating one or more sequences of said serial data block to said serial data block to generate a decodable data block; decoding said decodable data block to estimate a starting and ending state and determine a most likely sequence for said serial data block; and outputting an internal portion of said decodable data block. In a first embodiment, the method relates to appending and prepending sequences (e.g., initial and terminal subblocks) from the serial data block to the serial data block. A second embodiment relates to sequentially decoding the serial data block a plurality of times and outputting an internal block of the decoded data. A third embodiment relates to appending an initial subblock or prepending a terminal subblock of the serial data block, then outputting decoded data from an internal block of the modified data block. The algorithms and software are generally configured to implement one or more of the embodiments of the present method and/or any process or sequence of steps embodying the inventive concepts described herein.

The circuitry generally comprises (a) a buffer configured to receive a serial data block; (b) logic configured to concatenate one or more sequences of the serial data block to the serial data block; and (c) a decoder configured to (i) decode the serial data block and said one or more sequences, (ii) estimate a starting and ending state for the serial data block, and (iii) output an internal portion of said serial data block and said one or more sequences as decoded data. The systems (e.g., a receiver, transceiver, or wireless network) generally include a circuit embodying one or more of the inventive concepts disclosed herein.

The present invention advantageously reduces the complexity of a suboptimal convolutional decoder, ensures smooth (or continuous) state transitions at the beginning and end of the serial data block during decoding, and increases the reliability of the starting and ending states, without adding any overhead to the transmitted data block. In general, relative to the conventional approaches discussed above, for the same performance (e.g., number of decoding repetitions), the inventive approach generally provides greater reliability. Alternatively, for the same reliability, the inventive approach generally processes less data. These and other advantages of the present invention will become readily apparent from the detailed description of preferred embodiments below.

DETAILED DESCRIPTION OF THE PREFERRED EMBODIMENTS

Figure 1:
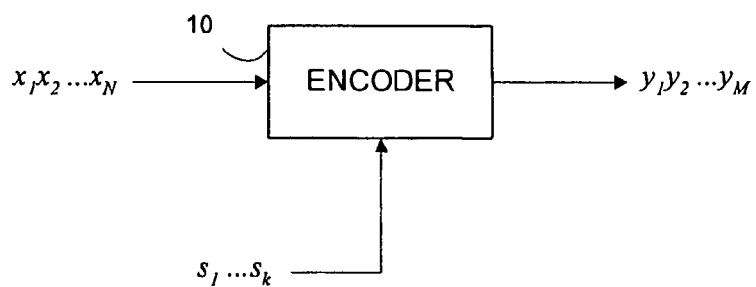
FIG. 1 is a diagram showing a conventional encoder configured to ensure that an ending state for a block of convolutional code is the same as its starting state.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to convey effectively the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are sometimes used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns methods, algorithms, software, circuitry, and systems for processing (and/or determining a value for) a serial data block using a low complexity, tailbiting Viterbi decoder. The method generally includes concatenating one or more sequences of said serial data block to said serial data block to generate a decodable data block; decoding said decodable data block to estimate a starting and ending state and determine a most likely sequence for said serial data block; and outputting an internal portion of said decodable data block. In a first embodiment, the method relates to appending and prepending sequences (e.g., initial and terminal subblocks) from the serial data block to the serial data block; a second embodiment relates to sequentially decoding the serial data block a plurality of times and outputting an internal block of the decoded data; and a third embodiment relates to appending an initial subblock or prepending a terminal subblock of the serial data block, then outputting decoded data from an internal block of the modified data block. The algorithms and/or software are generally configured to implement one or more of the embodiments of the present method and/or any process or sequence of steps embodying the inventive concepts described herein, although the term "algorithm" in this context is meant in a general sense (e.g., a logical sequence of steps taken to perform one or more mathematical and/or computational processes and/or operations), rather than a more specific, technical sense (such as "Viterbi algorithm," discussed below).

The circuitry generally comprises (a) a buffer configured to receive the serial data block; (b) logic configured to concatenate one or more sequences to the serial data block; and (c) a decoder configured to (i) decode the serial data block and said one or more sequences, (ii) estimate a starting and ending state for the serial data block, and (iii) output an internal portion of said serial data block and said one or more sequences as decoded data. The systems (e.g., a receiver, transceiver, or wireless network) generally include a circuit embodying one or more of the inventive concepts disclosed herein.

The present invention advantageously reduces the complexity of a suboptimal convolutional decoder, ensures smooth transitions at the beginning and end of the serial data block during decoding, and increases the reliability of the starting and ending states, without adding any overhead to the transmitted data block. In general, relative to the conventional approaches discussed above, for the same performance (e.g., number of decoding repetitions), the inventive approach generally provides greater reliability. Alternatively, for the same reliability, the inventive approach generally decodes less data, thereby (directly or indirectly) improving performance. The invention, in its various aspects, will be explained in greater detail below with regard to exemplary embodiments.

Exemplary Methods

The present invention relates to methods of processing and/or determining a value for a serial data block. A first embodiment relates to appending and prepending subblocks of the serial data block to the serial data block. A second embodiment relates to sequentially decoding the serial data block a number of times (e.g. 2 or 3 times) and outputting an internal block of the decoded data. A third embodiment relates to appending an initial subblock or prepending a terminal subblock of the serial data block (e.g., to create or make a modified data block), then outputting decoded data from an internal block of the modified data block (e.g., from a first point at least a traceback depth into the modified data block, to a point at least a traceback depth from the end of the modified data block). Each of these embodiments is intended to further reduce the complexity of a suboptimal convolutional decoder, ensure smooth transitions at the beginning and end of the serial data block during decoding, and increase the reliability of the starting and ending states, without adding any overhead to the transmitted data block.

Prepending and Appending Subblocks to the Serial Data Block

The present invention relates to methods of processing and/or determining a value for a serial data block. In a first embodiment, the method may comprise the steps of (a) appending an initial subblock of the serial data block to the serial data block; (b) prepending a terminal subblock of the serial data block to the serial data block; and (c) decoding the prepended terminal subblock, the serial data block, and the appended initial subblock to estimate a starting state, an ending state and a most likely sequence for the serial data block. Appending an initial subblock and prepending a terminal subblock to the serial data block reduces the complexity of the decoder and ensures smooth and/or continuous transitions at the beginning and end of the serial data block during decoding, without reducing or adversely affecting the reliability of the starting and ending state(s) or adding any overhead to the data block transmission. It is believed that the smooth decoding transitions result from the code trellis being in a steady state at the time of the transitions from the end of the prepended terminal subblock to the beginning of the serial data block and from the end of the serial data block to the beginning of the appended initial subblock.

The term "data block" generally refers to a data sequence of fixed and/or known length. Thus, the serial data block processed in the present method may have a length N. For example, 80 bits is a conventional fixed block length in certain digital audio standards. Even though the present decoding step is suboptimal and has reduced complexity relative to those described in the background references mentioned above, the present method enjoys particular applicability to decoding data blocks of relatively short length. Thus, in various implementations, N is from 32 to 256 bits, 40 to 200 bits, or 60 to 100 bits. However, in the present method, the convolutional code may be concatenated with one or more further convolutional codes (e.g., a "dual k" code) and/or a block code (e.g., a Reed-Solomon or error checking code). As a result, the received data block is not necessarily limited to such short sequences, but the data block being decoded according to the present invention preferably has a relatively short length.

The length of the initial subblock and the terminal subblock can vary. At one extreme, the entire data block may be prepended and appended. Preferably, each of the initial subblock and the terminal subblock has a length of at least a traceback depth. A "traceback depth" is generally related to, and thus may be selected or determined in a manner dependant on, the memory length or constraint length of the convolutional code. The traceback depth is generally the decoding depth (e.g., in a Viterbi decoder) where paths that start from any state should converge, and is typically further dependent on the code rate, the channel in which the system operates, the desired or target decoder performance and the initial state of the decoder (to the extent it is known). As the memory length of the convolutional code increases, the number of states increases, and the traceback depth increases. For example, in a conventional (d,k) code, k refers to the memory of the code (e.g., the maximum number of previous bits that determine the current state) and d refers to the free distance of the code. In many conventional wireless communications protocols, k is 6. The constraint length of a convolutional code is generally (k+1) bits. When the convolutional code is a (d,k) code, the traceback depth is generally larger than k, and may be as high as 5(k+1) or more bits. Typically, an algorithm adapted to traceback from a minimum state will have a shorter traceback depth than an algorithm adapted to traceback from an arbitrary state. Thus, generally speaking, the longer the traceback depth, the better the decoder performance.

The convolutional code may have a constraint length commonly used in wireless applications and/or digital broadcasting (e.g., audio) standards. Also, the requirement that the starting and ending states be the same is a constraint that exists for all tailbiting codes. However, most if not all convolutional coding schemes and algorithms suitable for use in or with the present invention are proprietary, and the constraints associated therewith do not lend themselves well to general characterization. In any case, the convolutional code(s) most suitable for the present invention typically only encode transitions between specific states. In a variety of applications for which the present invention is particularly suited, the convolutional code and the constraint(s) comply with a wireless data transmission protocol and/or digital broadcasting standard, such as IEEE Standard 802.11a, 802.11b, 802.11g, 802.11n, 802.16 and/or 802.20. Thus, the method may further comprise the step of receiving the fixed-length, serial data block. Also, the code may comprise nearly any cyclic code, such as convolutional codes and trellis codes.

As will be explained in greater detail below, the present decoding step preferably comprises Viterbi decoding (or detecting a sequence for) the prepended terminal subblock, the serial data block, and the appended initial subblock. Viterbi decoding efficiently determines which sequence from among all possible sequences has the highest likelihood of being the received sequence. Viterbi decoding the prepended terminal subblock improves, or contributes to improving, the estimate of the starting state. Viterbi decoding the appended initial subblock estimates or determines a value for the ending state. When the prepended terminal subblock has a length of at least a traceback depth, Viterbi decoding should converge by the time the end of the prepended terminal subblock is reached.

Given the constraint on all tailbiting encoded bitstreams (or data blocks) that the starting and ending states are the same, when the starting state and the ending state are not the same, this is a good indication of an error (e.g., in the transmitted sequence). Thus, the invention may be useful in applications for which tailbiting codes are used, such as wired modems, and the method may further comprise the step(s) of comparing the estimated starting state and the estimated ending state, and optionally, indicating an error if the estimated starting state and the estimated ending state are not identical.

An Exemplary Simplified Tailbiting Trellis Decoding Scheme

As stated above, one exemplary aspect of the invention relates to a low complexity tailbiting Viterbi decoder and methods for processing convolutional code blocks using the inventive decoder. In the present invention, the goal is to obtain the most likely (or "maximum likelihood") sequence in a block of data that is encoded using a tailbiting code in a relatively low-complexity Viterbi decoder, a reliable starting and ending state, and/or an indication of the reliability of the decoded sequence by comparing the estimate of the starting and ending state (e.g., comparing the starting state estimate and the ending state estimate to each other). At a certain traceback depth (denoted as "L"), the Viterbi algorithm has a reasonable likelihood of convergence. Although convergence is not guaranteed at any particular traceback depth, in most applications, a particular or predetermined traceback depth will lead to good sequence error rate at a reasonable latency.

Figure 3:
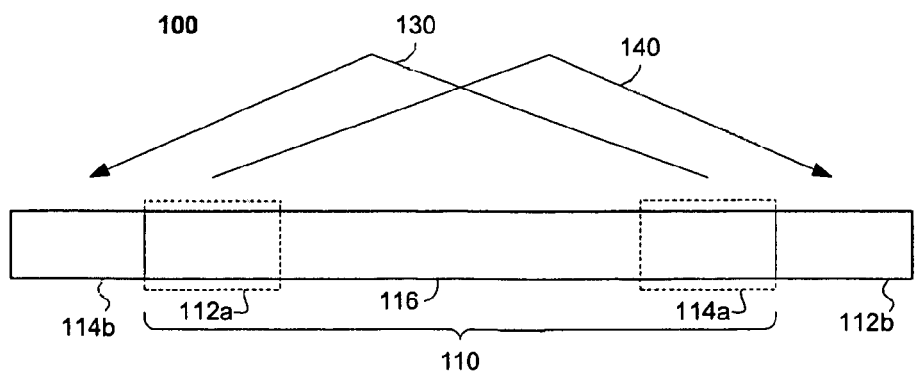
FIG. 3 is a diagram showing a preferred implementation of the present invention, in which an initial subblock is appended and a terminal subblock is prepended to a serial data block.

FIG. 3 shows an exemplary "circularized" code block 100 for use in the present invention. Circularized code block 100 comprises an encoded, received block 110 (in turn, comprising initial sequence 112a, data sequence 116 and terminal sequence 114a), a prepended sequence 114b and an appended sequence 112b. As shown by arrow 130, terminal sequence 114a may be copied and prepended to the beginning of encoded block 110, and as shown by arrow 140, initial sequence 112a may be copied and appended to the end of encoded block 110. As a result, if the length of initial sequence 112a (and thus, of appended sequence 112b) is equal to or greater than the traceback depth, after tracing back to the end of encoded block 110, the state will generally be the same as the state when tracing back to the beginning of encoded block 110. If the state is not the same, an error has occurred. On the other hand, if the state is the same, it is not necessarily true (but it very likely) that no error occurred. Although the tailbiting encoder encodes the same starting and ending state, after decoding, the states may not necessarily be the same because the state at the beginning of encoded block 110 is determined using prepended sequence 114b and at least a portion of initial sequence 112a, whereas the state at the end of encoded block 110 is determined using terminal sequence 114a, a portion of data sequence 116 and at least a portion of appended sequence 112b. However, if decoding is correct, the states will be the same, and an error will generally not be indicated. This may be more easily understood with reference to a more specific example.

If initial sequence 112a consists of a sequence $z_1 \ldots z_k$ and terminal sequence 114a consists of a sequence $z_{N-L+L} \ldots z_N$, then appended sequence 112b will generally consist of the sequence $z_1 \ldots z_k$ and prepended sequence 114b will generally consist of the sequence $z_{N-L+1} \ldots z_N$. Circularly combining these blocks as shown in FIG. 3 and as described above leads to a "circularized" code block 100 having continuous state transitions at the beginning and end of received block 110. Generally, in this first embodiment, the initial sequence consists of a subblock of the first L bits of the data block, and the terminal sequence consists of a subblock of the last L bits of the data block, where the traceback depth $\leq L$.

Such circular prepending and appending of encoded creates a smooth or continuous state transition at the edges of the original code block 110, and can effectively increase the efficiency and/or channel capacity of the code by enabling elimination of the conventional "known starting/ending state" overhead bits. Alternatively, the invention enables decreasing the traceback depth without increasing the conventional "known starting/ending state" overhead penalty.

Viterbi decoding generally starts from the beginning of the circularized code block 100 (e.g., bit $z_{N-L+1}$ of prepended sequence 114b) and stops at the end of the circularized code block 100 (e.g., bit $z_k$ of appended sequence 112b). Initially, Viterbi decoding may be conducted with an equal metric for all states. However, the decoder generally does not output the bits from the prepended sequence 114b or the appended sequence 112b, as will be explained below with regard to the present circuitry.

The prepended sequence 114b generally contributes to obtaining a reliable estimate of the starting state of original code block 110, and the appended sequence 112b generally ensures that the ending state of original code block 110 is reliable. Although the reliability of the starting state and ending state estimates is generally better than conventional decoding methods, there may be error patterns that cause a mismatch in the starting state and the ending state in the present invention. In general, the occurrence of such a mismatch indicates a sequence detection error. In one embodiment, a sequence detection error indication can be passed to the sequence detection algorithm downstream from the Viterbi decoder. Alternatively, the Viterbi algorithm can be re-run with this error information (for example, by biasing the weights to favor one or more starting states other than the decoded starting state). A fixed or predetermined number of retries may be conventionally set (e.g., by a counter) to place a bound or limit on the decoding time.

The present invention is not limited to the prepended/appended sequence example given above, which merely illustrates the present decoding method and algorithm. A receiver comprising the present decoder may decode from the beginning of a data frame, similar to conventional approaches (see, e.g., C. R. Cahn, "Viterbi Decoding with Tail Biting in the IEEE 802.16 Standard," IEEE 802.16 Broadband Wireless Access Working Group, Aug. 15, 2001). For example, after decoding the data frame twice (e.g., using decoding stages 0 to [2N−1], where N is the frame size), the output bits corresponding to the middle decoding stages (e.g., N/2 to [3N/2]−1) comprise the decoded bits. This approach contrasts with that of conventional methodology (e.g., Cahn, above), where the output corresponding to the decoding stages N to 2N−1 is used. In our case, as long as N/2>L, reliable decoded bits can be obtained.

The increase in complexity for the present scheme relates to the operations associated with Viterbi decoding the bits of the prepended and appended code sequences. However, if an alternate method (such as those discussed in the Discussion of the Background above) is used to further improve the error rates, the increase in complexity is a multiple of this complexity. The average increase in complexity in the present scheme might be less than 2 times, but the decoding hardware has to design for the worst case. Normally, a single cycle of Viterbi decoding for the circularized code block is sufficient to obtain commercially acceptable bit error rate performance.

Figure 4:
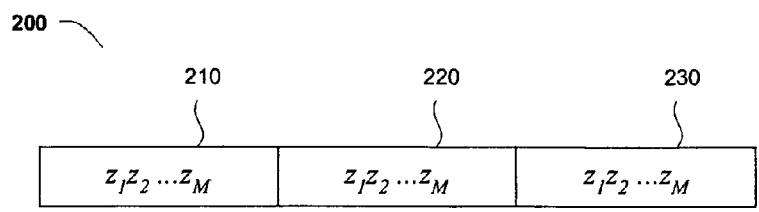
FIG. 4 is a diagram showing an alternative implementation of the present invention, in which a serial data block is decoded three times and the middle data block is output.

Sequentially Decoding the Serial Data Block and Outputting an Internal Data Block In a second embodiment, the present method determines a value for a serial data block, and comprises the steps of: (1) decoding the serial data block at least three times; and (2) outputting an internal decoded serial data block as the value for the serial data block. As for the first embodiment above, the serial data block comprises a cyclic or convolutional code and generally has a fixed length N (or, as shown in FIG. 4, M), where N (or M) may be an integer of, for example, from 32 to 256 bits. The cyclic or convolutional code typically comprises at least one constraint, which (together with the tailbiting constraint) may comply with a digital audio broadcasting protocol or a wireless data transmission protocol such as IEEE Standard 802.11a, 802.11b, 802.11g, 802.11n, 802.16 and/or 802.20. In addition, the method may further comprise (i) receiving the serial data block and/or (ii) comparing the estimated starting state and the determined ending state, and optionally, indicating an error if the estimated starting state and the estimated ending state are not identical.

As for the first embodiment above, Viterbi decoding is a preferred technique for processing serial data blocks in this second embodiment. For example, the present decoding step(s) and/or starting/ending state estimating and/or determining steps may comprise Viterbi decoding the serial data block. However, in this preferred case, the serial data block is generally Viterbi decoded at least three successive times. Consistent with the inventive approach, an internal decoded serial data block (e.g., a Viterbi decoded block other than the first or last Viterbi decoded block, such as the second Viterbi decoded block) is generally output as the value for the serial data block.

FIG. 4 shows an exemplary serial data block configuration 200 for processing convolutional code according to this second embodiment, generally comprising first (or "prepended") code block 210, serial data block 220 (to be decoded and output as received serial data), and third/last (or "appended") code block 230. Generally, the first code block 210 is received and stored in a buffer, and the stored data or code block is read three successive times to form serial data block configuration 200. Thus, the identity and/or sequence of first code block 210, serial data block 220, and last code block 230 are identical to one another (e.g., all consist of the sequence $z_1 z_2 \ldots z_M$). This approach further simplifies the trellis decoder, because circuitry (such as pointer logic and/or extra memory) for indicating and/or storing appended and/or prepended code sequences is not necessary.

As described above for the first embodiment of the present method, Viterbi decoding the first code block 210 and at least part of the second block 220 improves, or contributes to improving, the reliability of the estimate of the starting state of the data block and/or decoder trellis. Viterbi decoding the last code block provides a continuous state transition at the end of a data block. Because the identity and/or sequence of first code block 210 and last code block 230 are identical, the starting state and ending state should be the same. Because the serial data block is generally longer than the traceback depth (i.e., N>L), the decoder trellis will reach a steady state and have a maximum likelihood for convergence when the serial data block 220 is decoded. Consistent with the inventive approach, the decoded serial data block 220 (e.g., the second, internal or middle Viterbi decoded block) is generally output as the value for the serial data block. In part because the entire data block is effectively prepended and appended (and in part because one purpose of the present invention is to simplify the trellis decoding scheme), this second embodiment is particularly advantageous when the code block is small (e.g., generally less than about 200 bits, or in some cases less than about 100 bits).

Adding an Initial or Terminal Sequence to the Serial Data Block and Outputting Decoded Data from within the Serial Data Block In a third embodiment, the present method concatenates an initial or terminal subblock to a serial data block to form or create a modified data block, and comprises the steps of: (A) estimating a starting state following (e.g., for the first position after) an initial portion of the modified data block; (B) decoding a remainder of the modified data block; and (D) outputting the decoded modified data block remainder up to a terminal portion of the modified data block as decoded data. In this third embodiment, the initial subblock (which, like the first embodiment above, is appended to the serial data block) preferably comprises or consists of the first 2*L bits of the serial data block, and the terminal subblock (which, like the first embodiment above, is prepended to the serial data block) preferably comprises or consists of the last 2*L bits of the serial data block, where the traceback depth ≦L. However, decoded data is generally output beginning at the first bit position following an initial portion of the modified data block, where the initial portion preferably has a length of at least the traceback depth (e.g., L bits as indicated above).

Thus, the initial or terminal subblock (or sequence) added to the serial data block is longer than the initial portion of the modified data block to be decoded, generally at least twice the length of the initial or terminal subblock. For example, if the initial portion (to be decoded and/or for estimating the starting state [along with a subsequent portion of the modified data block]) consists of the first $P_1$ bits of the received data block, then the initial subblock generally includes at least the first $P_2$ bits of the received data block, where $P_2 \geq P_1$.

Figure 5:
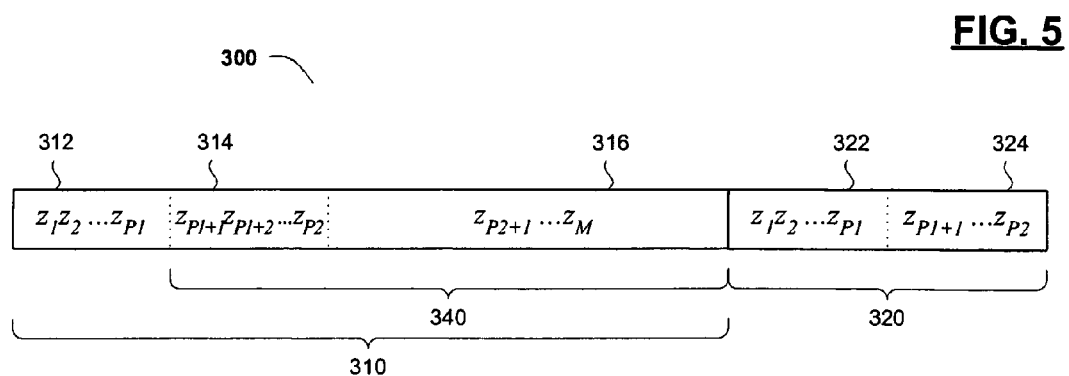
FIG. 5 is a diagram showing another alternative implementation of the present invention, in which an initial subblock is appended to a serial data block and the decoded data is output from a location internal to the data block.

As for the first and second embodiments above, the serial data block comprises a cyclic or convolutional code that may have at least one constraint that may comply with a wireless data transmission protocol and that may have a fixed length N (or, as shown in FIG. 5, M). Also, the method may further comprise comparing the estimated starting state and ending state, and optionally, indicating an error if the estimated starting and ending state(s) are not identical.

Viterbi decoding is also a preferred aspect of this third embodiment. For example, the step of estimating a starting state for the modified data block preferably comprises Viterbi decoding the initial portion and L additional stages (or bits) of the modified data block remainder, where L is the traceback depth (and where L may be $P_2 - P_1$, as set forth two paragraphs above). Furthermore, the decoding step may comprise Viterbi decoding the modified serial data block remainder (the modified data block minus the initial portion) and the remaining appended initial subblock or prepended terminal subblock. As a result, the method may further comprise the step(s) of (i) determining an ending state using the terminal portion of the (decoded) modified data block (where the terminal portion has a length of at least the traceback depth), and/or (ii) reversing the Viterbi decoded modified data block remainder and the Viterbi decoded remaining appended initial subblock (or remaining prepended terminal subblock) to provide a Viterbi decoded serial data block.

FIG. 5 shows a first exemplary serial data block configuration 300 for processing convolutional code according to this third embodiment, generally comprising a received serial data block 310 and an appended initial code subblock 320. Generally, appended initial subblock 320 includes appended initial portion 322, which is identical to initial data portion 312 (e.g., the first L bits of serial data block 310), and appended initial subblock remainder 324, which is identical to initial data subblock remainder portion 314 (e.g., the second L bits of serial data block 310). Like the embodiment(s) described above, serial data block 310 may be received and stored in a buffer. Serial data block 310 and/or modified data block 300 is decoded beginning at bit $z_1$ in initial portion 312, and decoded data are output beginning at a point in initial subblock remainder portion 314 or serial data block remainder 316, depending on the traceback depth. For example, if the traceback depth $L=P_1$, then a decoding decision is made after bit $z_{P_1+1}$ has been processed, and decoded data are output beginning at bit position $z_{P_1+1}$ in serial data block remainder 340. The serial data block remainder 340 is then decoded and output as the value for bit positions $z_{P_1+1}$ through $z_M$ of the serial data block. For bit positions $z_1$ through $z_{P_1}$, appended initial subblock 320 is decoded, but only initial portion 322 is output as decoded data. Thus, alternatively, appended initial subblock remainder 324 may have a length of at least $P_2 - P_1$. A length of at least a traceback depth is preferred for appended initial subblock remainder 324.

Figure 6A:
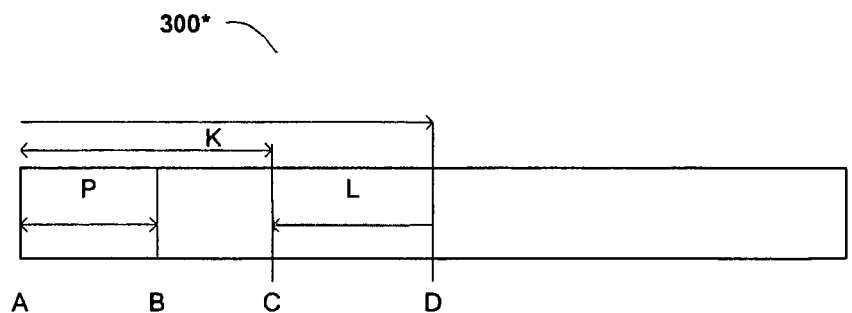
FIGS. 6A-6C show a modified serial data block useful for explaining a general operation of the alternative implementation of FIG. 5.
Figure 6B:
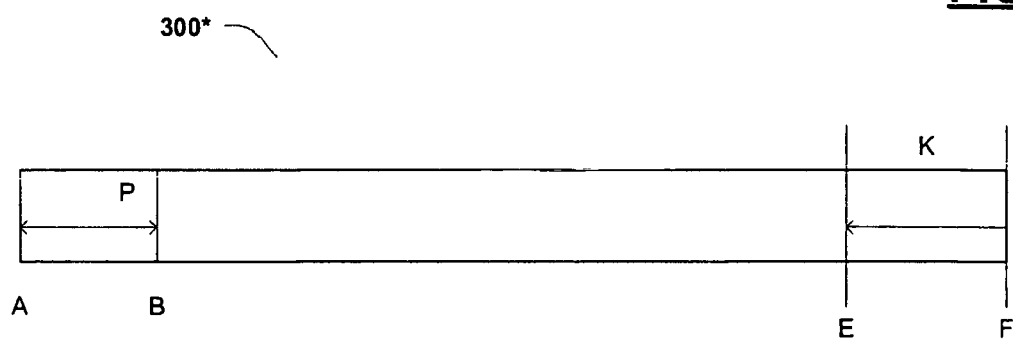
Figure 6C:
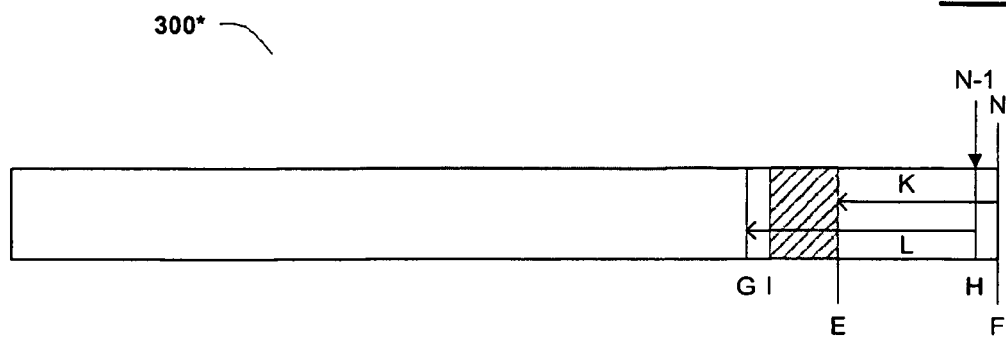

A more general operation of this embodiment shall be explained with regard to FIGS. 6A-6C. FIGS. 6A-6C each show a general modified serial data block 300*, having a concatenated initial or terminal subblock therein. Generally, with reference now to FIG. 6A, path metrics are computed for modified serial data block 300*, starting from bit position A up to bit position D. Decoded data may then be output by tracing back L bits to bit position C, and outputting the data starting at bit position C. The distance in bits between bit positions A and B, P, generally corresponds to the length $P_1$ of appended initial portion 322 in FIG. 5. Referring back to FIG. 6A, for optimal performance, K and P are each $\geq L$, although P or K can be $<L$ (e.g., to decrease the operational speed of the decoder, but at the expense of optimal performance; if $K<L$, then $P<L$; if $P \geq L$, then $K \geq L$).

FIG. 6B shows the modified serial data block 300* at the time that the final data state (i.e., up to/terminating at bit position E) is output. For best results, the distance K between bit positions E and F should be at least L bits (i.e., $K \geq L$). However, as discussed above, K may be smaller than L. For example, referring to FIG. 6C, at bit position H (one bit from the end of modified serial data block 300*), one traces back L bits to bit position G and outputs decoded data at that point. However, when K is smaller than L, at the end of modified serial data block 300*(bit position F), one traces back K bits to bit position E' and outputs all of the decoded bits from bit position G to bit position E'.

This third approach provides both (i) a reliable estimate, determination or calculation of the ending state of the data block and/or decoder trellis and (ii) the value for bit positions $z_1$ through $z_{P1}$ of the serial data block with a continuous state transition at the end of the decoded data. Thus, consistent with the inventive approach, an internal portion of the (modified) serial data block 300 is decoded and output as the Viterbi decoded block. However, this third approach generally necessitates re-ordering the decoded data. Decoded data may be re-ordered (or reversed) by storing the decoder output in a buffer having appropriate pointer logic to indicate the correct bit positions for the decoded data. When the decoded data are output in parallel (e.g., when the decoder has a parallel downstream interface), there is no latency penalty using this third approach.

This third approach also works for prepending a terminal subblock (which comprises a [i] terminal portion that may have a length of at least a traceback depth and [ii] a terminal subblock remainder that may have a length of at least a traceback depth or a decoder memory length) of the serial data block to the serial data block. In such a case, the starting state is estimated using at least the prepended terminal portion, outputting decoded data starts at the first bit position of the terminal subblock remainder following the prepended terminal portion and ends at the last bit position of the terminal portion in the serial data block (when the prepended terminal portion has a length equal to the traceback depth), but decoding continues until the end of the serial data block in order to provide a continuous state transition at the end of the decoded data.

One further advantage of this approach is that the decoder can generally operate on the same sequence as the rest of the receiver circuitry (although the rate/speed will be greater than that of the rest of the receiver circuitry, generally by a factor of $[(M+P_1+P_2)/M]$). However, because the data is output from a position inside the received data block, the data output from the decoder will not be in the same sequence as the received serial data block 310. Thus, the present method may further comprise the step of re-ordering or rearranging the decoded data, such that the decoded appended subblock is subsequently read or transmitted before the decoded remainder of the serial data block. Because this third embodiment can append an initial subblock having a length of about twice the decoder traceback depth (or less), this embodiment may be advantageous when the code block is slightly larger than in other embodiments (e.g., from about 60, 80 or 100 bits to about 250, 500, or 1000 bits).

Figure 7:
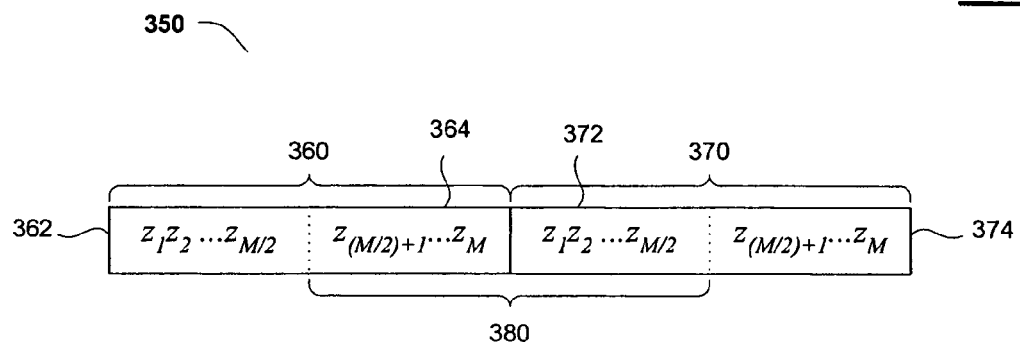
FIG. 7 is a diagram showing a further alternative implementation of the present invention, in which the entire serial data block is appended to itself (e.g., it is decoded twice), and the decoded data is output from the middle of the data block.

FIG. 7 shows a second exemplary serial data block configuration 350 for processing convolutional code according to this third embodiment, generally comprising first serial data block 360 and second serial data block 370. First serial data block 360 generally consists of first portion 362 and second portion 364, and second serial data block 370 generally consists of first portion 372 and second portion 374. Generally, for logical simplicity, the first and second serial data blocks 360-370 are identical to one another, as are first portions 362 and 372, and independently, second portions 364 and 374. Like the embodiment(s) described above, first serial data block 360 may be received and stored in a buffer, then read twice to form serial data block configuration 350. As for the other embodiments of the present method, the internal block or "middle portion" 380 of the data block configuration 350 is decoded and output as the value for the decoded serial data block. However, as for the example of FIG. 5, there is a slight twist as to how the decoded data is output.

In the example of FIG. 7, M is generally an even number. Viterbi decoding part or all of the first serial data block 360 provides a reliable estimate of the starting state of the data block 380 and/or decoder trellis, and Viterbi decoding the second serial data block 370 provides a reliable estimate, determination or calculation of the ending state of the data block and/or decoder trellis. However, the second portion 364 (e.g., the last M/2 data bits $z_{(M/2)+1} \ldots z_M$ of first serial data block 360) and the first portion 372 (e.g., the first M/2 data bits $z_1 z_2 \ldots z_{M/2}$ of second serial data block 370) are decoded and output as the value for the serial data block. Thus, consistent with the inventive approach, the middle portion 380 of the data block configuration 350 is output as the Viterbi decoded data. Where first and second serial data blocks 360-370 have a length of at least twice the traceback depth (e.g., M≧2L), the decoder trellis will reach a steady state and have a maximum likelihood for convergence when the "middle portion" 380 of the data block configuration 350 is decoded.

One advantage of this approach is that the decoder can generally operate at a lower multiple than in the approaches of the cited background literature. Furthermore, although there may be some latency in the decoder output, this latency is generally lower or reduced relative to the conventional approaches discussed in the Discussion of the Background above. Thus, for the same performance (e.g., number of decoding repetitions), the inventive approach generally provides greater reliability; alternatively, for the same reliability, the inventive approach generally processes less data. Moreover, because the data may be output from a well-defined and logically convenient and/or advantageous position at the midpoint of the serial data block, the logic for decoding and outputting the received data block may be relatively simple. In addition, the last L states (where L is the traceback depth) of the serial data block may be decoded more reliably than the conventional approaches discussed above, because appended remainder portion(s) 324 (FIG. 5) or 374 (FIG. 7) contribute to the convergence of the Viterbi decoder at those states.

Results from the Present Tailbiting Trellis Decoding Schemes

Figure 8:
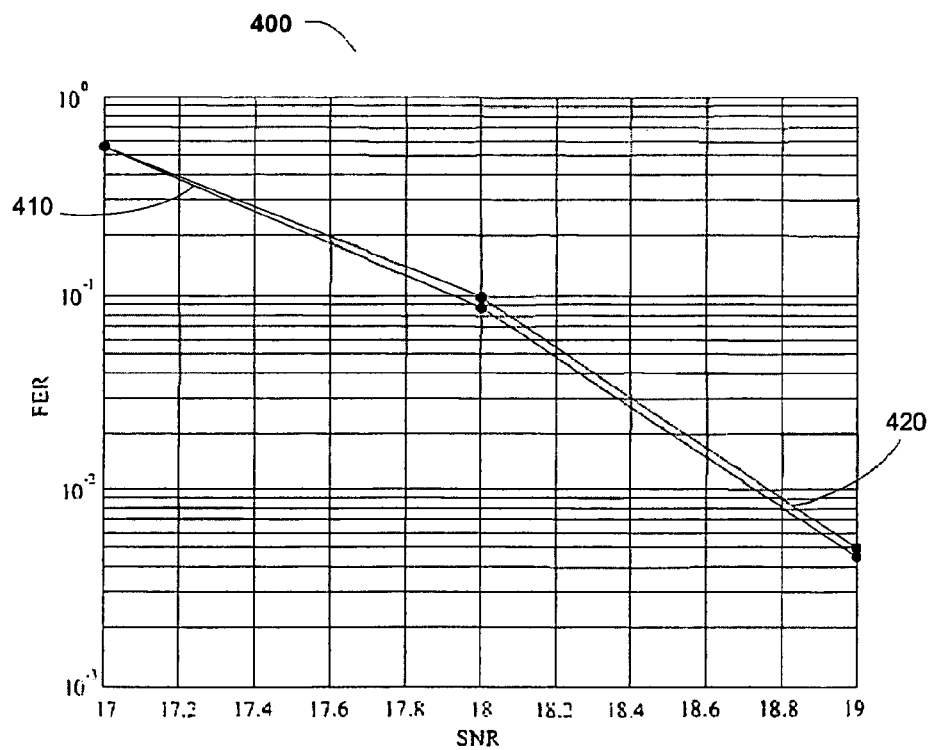
FIG. 8 is a plot of the error rate as a function of signal-to-noise ratio (SNR) for a decoding technique according to the present invention and a conventional decoding technique using zero padding for convolution code blocks having starting and ending states of the same length.

To demonstrate the decoding performance of the present scheme, a simulation for a code block length of 192 bits was performed. The present decoding algorithm was compared to an otherwise identical convolutional code block, but having a zero padded tail (i.e., in which the starting/ending state consisted of six [6] all zero bits) and a decoder configured for known starting and ending states, taking into account the code rate loss. The code block arrangement representative of the invention in FIG. 8 used both appended and prepended subblocks, each having a length of 72 bits. The results are shown in FIG. 8, which is a graph 400 depicting the bit error rate (BER) as a function of signal-to-noise ratio ("SNR," defined in this case as $E_b/N_0$) for the two decoding schemes.

The results for the present tailbiting convolutional code scheme, using the present low complexity decoder (described below), are plotted as line 410. Results for the conventional zero-padded convolutional decoding scheme are plotted as line 420. The comparative results show that the present scheme has performance similar to, or approaching, the conventional zero-padded scheme for the same SNR. The present low complexity decoder is only slightly more complex than a conventional convolutional decoder using known starting and ending states, while it is generally significantly simpler than conventional tail-biting Viterbi decoders and algorithms in which the starting and ending states are unknown.

Figure 9:
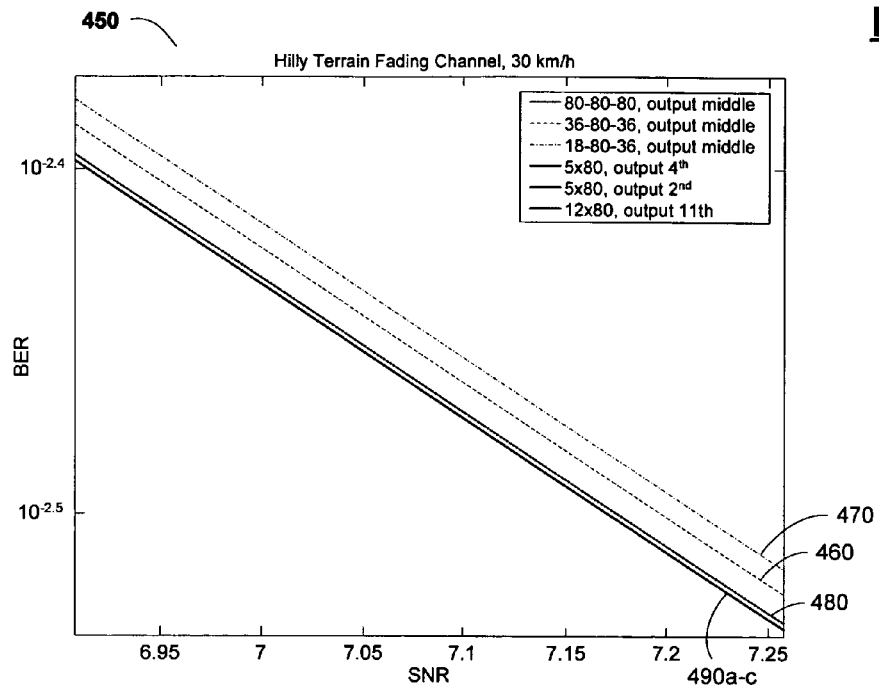
FIG. 9 is a comparison of the results provided by various implementations embodying the present invention.

To further reduce the complexity of the present tail-biting Viterbi decoder and method (although at the expense of potential performance loss), the size of the prepended subblock (denoted as L1) and the appended subblock size (denoted as L2) was reduced to less than half of the block size. FIG. 9 shows the performance of various implementations of the present decoding scheme for a block of data with block length N=80 transmitted through a mobile hilly terrain environment and decoded using the present tail-biting decoder with appended and prepended subblocks having lengths L1=L2=80 (case 1), lengths L1=L2=36 (case 2), and separately, lengths L1=18 and L2=36 (case 3).

Results 450 for cases 1, 2, and 3 are shown in lines 480, 460, and 470, respectively. Case 1 (representative of the second embodiment above) showed substantially no performance loss relative to decoding 5 times or even 1,2 times (lines 490a-c, which are essentially superimposed on one another). The fact that two of the lines 490a-b, for the cases where the code block was decoded 5 times and either the second block (490b) or the fourth block (490a) were output as the decoded data, were essentially superimposed demonstrates that one obtains substantially the same results as long as an internal (non-terminal) code block is selected for the decoded output. Case 2 showed almost no performance loss relative to case 1 (about −0.025 dB). Even for the case 3 (which configuration contains only 134 decoding stages), the performance loss is only about −0.05 dB or less relative to case 1, decoding the entire block three times (which configuration contains 240 decoding stages), thereby demonstrating that prepending and appending relatively short sequences of the code block does not significantly adversely affect performance.

Exemplary Software

The present invention also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the invention relates to algorithms and/or software that implement the above method(s). For example, the invention may further relate to a computer program, computer-readable medium or waveform containing a set of instructions which, when executed by an appropriate processing device (e.g., a signal processing device, such as a microcontroller, microprocessor or DSP device implementing the present Viterbi decoder), is configured to perform the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape, hard disk drive, or ROM (e.g., EPROM, boot ROM or flash memory) and/or RAM (e.g., DRAM, SRAM or pseudo-SRAM). Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer-readable medium or waveform comprises at least one instruction to (i) Viterbi decode the prepended terminal subblock, the serial data block, and the appended initial subblock; (ii) compare the estimated starting state and the estimated ending state; and/or (iii) indicate an error if the estimated starting state and the estimated ending state are not identical.

An Exemplary Circuit

In a further aspect, the present invention relates to a circuit, comprising (a) a buffer configured to receive a serial data block; (b) logic configured to concatenate one or more sequences of the serial data block to the serial data block; and (c) a decoder configured to (i) decode the serial data block and the one or more sequences, (ii) estimate a starting and ending state for the serial data block, and (iii) output an internal portion of said serial data block and said one or more sequences as decoded data. The present circuitry is generally configured to implement the present method described above, and this circuitry represents a minimum set of circuit elements adapted to perform any of the embodiments of the present method above. Thus, in further embodiments directed towards implementing one or more of the embodiments of the present method above, the logic may be further configured to append an initial subblock and/or prepend a terminal subblock of the serial data block to the serial data block, and the decoder may be further configured to estimate (1) the starting state from at least the prepended terminal subblock and/or (2) the ending state from at least the appended initial subblock.

In further embodiments, the circuit may further comprise output circuitry configured to output the decoded serial data block, and/or the logic may further comprise pointer logic configured to indicate an end location in the buffer for the initial subblock and/or a start location in the buffer for the terminal subblock. In addition, the logic may be further configured to instruct the decoder to output (a) a decoded appended initial subblock remainder, then the decoded remainder of the serial data block, or (b) a decoded serial data block portion/remainder, then the prepended terminal subblock remainder, consistent with the third embodiment of the present method above. In a preferred embodiment of the present circuit, the decoder comprises a Viterbi decoder. Alternatively and/or additionally, the decoder may comprise an estimator.

Figure 2:
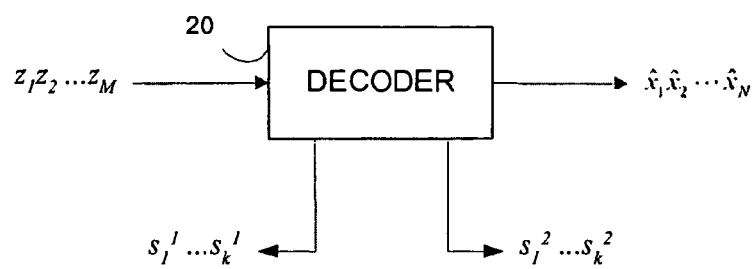
FIG. 2 is a diagram showing a decoder configured to determine whether an ending state for a block of convolutional code is the same as its starting state.
Figure 10:
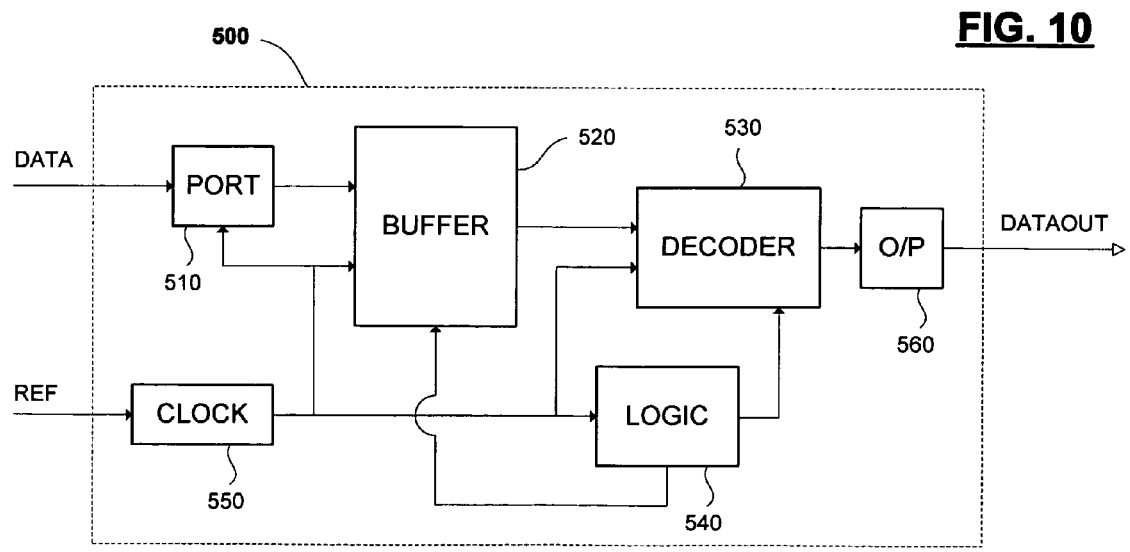
FIG. 10 is a block diagram of an exemplary decoder according to the present invention.

FIG. 10 shows an exemplary receiver 500, including receiving port 510, buffer 520, decoder 530, decoder logic 540, clock 550 and output circuitry 560. Generally, a serial data block DATA is received from a channel into port 510. The channel is preferably a wireless channel that, for example, is compliant with one or more IEEE standards for wireless communications (e.g., 802.11a, 802.11b, 802.11g, 802.11n, 802.16 and/or 802.20). Port 510 is a conventional (and in one embodiment, wireless) receiving port that may have an antenna communicatively coupled thereto and that is configured to receive analog or digital data DATA (e.g., encoded sequence $z_1 z_2 \ldots z_M$ with [Gaussian] channel noise added thereto; see, e.g., FIG. 2). In the case of analog data, port 510 may comprise conventional sampling and buffer and/or amplifier circuitry. In the case of digital data, port 510 may comprise latch and/or amplifier circuitry. It is well within the abilities of one skilled in the art to design and use such port circuitry.

Buffer 520 generally comprises a memory array configured to store one or more serial data blocks, and may comprise a conventional first-in-first-out (FIFO) buffer, a simplex dual port memory with one or more pointers adapted to identify predetermined bit locations (e.g., the end of the initial subblock, the beginning of the terminal subblock, the midpoint of the serial data block, etc.), one or more shift registers (and if more than one, having a demultiplexer in communication with inputs thereof configured to store part or all of a serial data block in a particular shift register and a multiplexer in communication with outputs thereof configured to select part or all of a serial data block in a particular shift register for outputting to decoder 530), etc. In one implementation, buffer 520 comprises an embedded memory.

Decoder 530 typically comprises a Viterbi decoder, configured to decode the serial data block and estimate a starting state and an ending state for the serial data block, generally using a conventional Viterbi algorithm (which may be implemented in hardware and/or software, but typically, in hardware). Thus, the decoder in the present circuit may be adapted for (i) hard decisions or soft decisions, (ii) punctured code or non-punctured code, and/or (iii) concatenated code (e.g., a convolutional code block concatenated with a block code sequence and/or a second convolutional code block, as described above). Decoder 530 may be further adapted to process code at a conventional rate of k/n, where n>k (or, consistent with the above description, N/M or N/M). Also, when decoder 530 comprises a Viterbi decoder, the Viterbi decoder may be configured to eliminate or "prune" branches from the decoder trellis that correspond to disallowed states (e.g., code containing a data sequence that violates one or more coding constraints).

Decoder logic 540 provides instructions, commands and/or control signals to the buffer 520 and decoder 530 in receiver 500. Thus, logic 540 may control (i) reading from and writing to buffer 520, (ii) setting or resetting one or more pointers in buffer 520, (iii) decoding/estimating/determining/calculating functions in decoder 530, etc. Reading from and writing to buffer 520 may be controlled by activation and deactivation of one or more write enable and/or read enable signals, selection of a particular shift register or other memory element within buffer 520 for storing or outputting data using a (de)multiplexer, etc. The decoder functions are described elsewhere herein, but the timing of such decoder functions (e.g., when to start and/or stop such functions), as well as reading functions within buffer 520 (e.g., reading a particular initial or terminal subblock) may be controlled by one or more counters in logic 540. In an embodiment of decoder 530 adapted for implementing the embodiment of the present method exemplified in FIG. 7, the timing of functions in decoder 530 and certain reading functions in buffer 520 may be controlled using, e.g., relatively simple divider logic.

It is well within the abilities of those skilled in the art to design, implement and use logic configured to perform such control functions.

Clock 550 receives a reference clock signal (e.g., REF) and provides a periodic signal having a fixed and/or predetermined frequency to other circuit blocks in receiver 500. However, the clock or timing signal received in decoder 530 may be multiplied by a conventional clock multiplier before use (as described above). The clock or timing signal received in decoder logic 540 may be used by one or more counters therein (e.g., the counter[s] may count clock cycles to control the state of one or more control signals generated in logic block 540). Output circuitry 560 receives decoded data from decoder 530 and provides output data DATAOUT (e.g., decoded, noise-affected sequence $\hat{x}_1\hat{x}_2 \ldots \hat{x}_N$; see FIG. 2). Output circuitry 560 is conventional, and may comprise one or more conventional amplifiers and one or more conventional output buffer(s) and/or conventional output driver(s).

An Exemplary Receivers System and Network

A further aspect of the present invention relates to a receiver, comprising the present circuit and (if not already present or required) a receiver port communicatively coupled to the buffer, configured to receive serial data from a channel. The receiver port is generally as described above with regard to port 510 in the present circuit. In one implementation, the present receiver is embodied on a single integrated circuit.

The receiver may further include a clock circuit configured to provide a reference clock signal to the receiver port and the buffer. In further embodiments, the receiver may convert serial data from the network to parallel data for a downstream device or circuit, and convert parallel data from the device (or the same or different circuit) to serial data for the network.

The present invention relates to a system for transferring data on or across a network, comprising the present receiver and at least one transmitter, communicatively coupled to the receiver port of the receiver, configured to transmit one or more serial data blocks to an external receiver. The system may further comprise an encoder communicatively coupled to the transmitter and configured to generate the serial data block(s). The encoder, which is largely conventional, generally encodes cyclic or convolutional code, which may be interleaved and/or concatenated with other codes as described herein. The encoder in the present system is slightly different from encoders that have been used to generate code having known starting and ending states (e.g., zero-padded data blocks).

As explained above, the present invention is particularly suited for wireless data communications. Thus, the present system and/or receiver may comply with a digital audio broadcasting protocol or one or more IEEE Standards for wireless communications (e.g., 802.11a, 802.11b, 802.11g, 802.11n, 802.16 and/or 802.20).

A further aspect of the invention concerns a wireless network, comprising (a) a plurality of the present systems, communicatively coupled to each other; and (b) a plurality of communications devices, wherein each communications device is communicatively coupled to at least one of the systems. In various embodiments, the network comprises a wireless network and/or one that is compatible with one or more of IEEE Standards 802.11a, 802.11b, 802.11g, 802.11n, 802.16 and/or 802.20 (preferably one that is compatible with IEEE Standard 802.11a, 802.11g or 802.16), and each of the plurality of information blocks may comprise a standard (digital and/or audio) data block (80 bits long). The network may have one or more channels (or characteristic signal-carrying frequencies or frequency bands), over which the serial data blocks may be transmitted.

CONCLUSION/SUMMARY

Thus, the present invention generally relates to low-complexity techniques for decoding information, and more specifically, to methods, algorithms, software, circuits and systems for communicating data in a wireless network using a low complexity, tailbiting Viterbi decoder. The present invention advantageously reduces the complexity of a suboptimal convolutional decoder, ensures smooth transitions at the beginning and end of the serial data block during decoding, and increases the reliability of the starting and ending states, without adding any overhead to the transmitted data block.

The method generally includes concatenating one or more sequences of a serial data block to the serial data block to generate a decodable data block; decoding the decodable data block to estimate a starting and ending state and determine a most likely sequence for the serial data block; and outputting an internal portion of the decodable data block. In a first embodiment, the method relates to appending and prepending sequences (e.g., initial and terminal subblocks) of the serial data block to the serial data block. A second embodiment relates to sequentially decoding the serial data block a plurality of times and outputting an internal block of the decoded data. A third embodiment relates to appending an initial subblock or prepending a terminal subblock of the serial data block, then outputting decoded data from an internal block of the modified data block. The algorithms and software are generally configured to implement one or more of the embodiments of the present method and/or any process or sequence of steps embodying the inventive concepts described herein.

The circuitry generally comprises (a) a buffer configured to receive a serial data block; (b) logic configured to concatenate one or more sequences of the serial data block to the serial data block; and (c) a decoder configured to (i) decode the serial data block and said one or more sequences, (ii) estimate a starting and ending state for the serial data block, and (iii) output an internal portion of said serial data block and said one or more sequences as decoded data. The systems (e.g., a receiver, transceiver, or wireless network) generally include a circuit embodying one or more of the inventive concepts disclosed herein.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of processing a serial data block, comprising the steps of:
   a) concatenating one or more sequences of said serial data block to said serial data block to generate a decodable data block;
   b) decoding said decodable data block by computing path metrics for said decodable data block up to a first bit position to estimate a starting state and from a second bit position to estimate an ending state, and determining a most likely sequence for said serial data block such that said starting state and said ending state have essentially a same value; and c) outputting an internal portion of said decodable data block by tracing back from said first bit position to a third bit position and tracing back from said second bit position to a fourth bit position, and outputting from said third bit position to said fourth bit position.

2. The method of claim 1, wherein concatenating said one or more sequences of said serial data block comprises appending an initial sequence of said serial data block to said serial data block.

3. The method of claim 2, wherein concatenating said one or more sequences of said serial data block further comprises prepending a terminal sequence of said serial data block to said serial data block.

4. The method of claim 3, wherein each of said initial sequence and said terminal sequence consists essentially of said serial data block.

5. The method of claim 1, wherein concatenating said one or more sequences of said serial data block comprises prepending a terminal sequence of said serial data block to said serial data block.

6. The method of claim 1, wherein at least one of said one or more sequences has a length of at least a traceback depth.

7. The method of claim 6, wherein said one or more sequences has a total length of at least two times a traceback depth.

8. The method of claim 1, wherein said serial data block comprises a convolutional code.

9. The method of claim 8, wherein said convolutional code comprises at least one constraint.

10. The method of claim 9, wherein said convolutional code and said at least one constraint comply with a wireless data transmission or digital audio broadcasting protocol.

11. The method of claim 10, wherein said convolutional code and said at least one constraint comply with said wireless data transmission protocol, and said wireless data transmission protocol complies with a standard selected from the group consisting of IEEE Standard 802.11a, 802.11b, 802.11g, 802.11n, 802.16 and 802.20.

12. The method of claim 1, wherein the step of decoding comprises Viterbi decoding said decodable data block.

13. The method of claim 1, further comprising the step of comparing said estimated starting and ending state.

14. The method of claim 1, further comprising the step of indicating an error when said estimated starting and ending state are not identical.

15. The method of claim 1, further comprising the step of receiving said serial data block.

16. A method of processing a serial data block, comprising the steps of:

reading said serial data block a plurality of times to generate a decodable data block;

decoding said decodable data block by computing path metrics for said decodable data block up to a first bit position to estimate a starting state and from a second bit position to estimate an ending state, and determining a most likely sequence for said serial data block such that said starting state and said ending state have essentially a same value; and outputting an internal portion of said decodable data block by tracing back from said first bit position to a third bit position and tracing back from said second bit position to a fourth bit position, and outputting from said third bit position to said fourth bit position.

17. The method of claim 16, wherein decoding said decodable data block comprises sequentially decoding said serial data block a plurality of times.

18. The method of claim 16, wherein computing path metrics comprises initializing an equal metric for all states.

19. The method of claim 16, further comprising indicating an error when said estimated starting and ending state are not identical and re-decoding said decodable data block with said indication of error.

20. The method of claim 19, wherein computing path metrics comprises biasing path metrics to favor one or more starting states other than said initially-decoded starting state.

21. The method of claim 19, further comprising setting a fixed or predetermined number of re-decodings.

* * * * *